(12) United States Patent
Hung et al.

(10) Patent No.: US 10,957,384 B1
(45) Date of Patent: Mar. 23, 2021

(54) PAGE BUFFER STRUCTURE AND FAST CONTINUOUS READ

(71) Applicant: MACRONIX INTERNATIONAL CO., LTD., Hsinchu (TW)

(72) Inventors: Ji-Yu Hung, Miaoli (TW); Shuo-Nan Hung, Hsinchu (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 16/581,562

(22) Filed: Sep. 24, 2019

(51) Int. Cl.
*G11C 16/06* (2006.01)
*G11C 11/4094* (2006.01)
*G11C 29/00* (2006.01)
*G11C 29/42* (2006.01)
*G11C 11/4093* (2006.01)

(52) U.S. Cl.
CPC ...... *G11C 11/4094* (2013.01); *G11C 11/4093* (2013.01); *G11C 29/42* (2013.01); *G11C 29/789* (2013.01)

(58) Field of Classification Search
CPC .................................................. G11C 29/42
USPC .................................................. 365/185.09
See application file for complete search history.

(56) References Cited

U.S. PATENT DOCUMENTS

| 5,768,215 | A  | 6/1998  | Kwon et al.   |
|-----------|----|---------|---------------|
| 6,615,307 | B1 | 9/2003  | Roohparvar    |
| 7,423,915 | B2 | 9/2008  | Leong et al.  |
| 7,644,224 | B2 | 1/2010  | Murin et al.  |
| 8,261,008 | B2 | 9/2012  | Que           |
| 8,358,558 | B2 | 1/2013  | Lee et al.    |
| 8,375,273 | B2 | 2/2013  | Hara          |
| 8,705,293 | B2 | 4/2014  | She et al.    |
| 8,902,668 | B1 | 12/2014 | Dutta et al.  |
| 9,009,566 | B2 | 4/2015  | Hung et al.   |

(Continued)

FOREIGN PATENT DOCUMENTS

| CN | 103871447 B | 3/2017 |
|----|-------------|--------|
| JP | 2003529883 A | 10/2003 |

(Continued)

OTHER PUBLICATIONS

"3V, 2G/4G-bit NAND Flash Memory, MX30LFx4G18AC", Macronix International Co., Ltd., http://www.macronix.com, Revision 1.4, Jan. 20, 2017, 80 pages.

(Continued)

*Primary Examiner* — Hoai V Ho
(74) *Attorney, Agent, or Firm* — Haynes Beffel & Wolfeld LLP

(57) ABSTRACT

A memory device such as a page mode NAND flash, including a page buffer with first and second-level buffer latches is operated using a first pipeline stage, to transfer a page to the first-level buffer latches; a second pipeline stage, to clear the second-level buffer latches to a third buffer level and transfer the page from the first-level buffer latches to the second-level buffer latches; and a third pipeline stage to move the page to the third buffer level and execute in an interleaved fashion a first ECC function over data in a first part of the page and output the first part of the page while performing a second ECC function, and to execute the first ECC function over data in a second part of the page in the third buffer level, and to output the second part while performing the second ECC function.

18 Claims, 7 Drawing Sheets

(56) References Cited

U.S. PATENT DOCUMENTS

| | | |
|---|---|---|
| 9,053,762 B2 | 6/2015 | Hirobe |
| 9,136,006 B2 | 9/2015 | Hung et al. |
| 9,349,469 B2 | 5/2016 | Chen et al. |
| 9,411,521 B2 | 8/2016 | Lu et al. |
| 9,483,348 B2 | 11/2016 | Yun |
| 9,536,601 B2 | 1/2017 | Chen et al. |
| 9,552,882 B2 | 1/2017 | Tseng et al. |
| 9,690,650 B2 | 6/2017 | Liu et al. |
| 9,971,647 B2 | 5/2018 | Michael |
| 2003/0093744 A1 | 5/2003 | Leung et al. |
| 2004/0109358 A1 | 6/2004 | Roohparvar et al. |
| 2006/0146607 A1* | 7/2006 | Hosono .............. G11C 16/10 365/185.12 |
| 2009/0168530 A1 | 7/2009 | Yamamura et al. |
| 2011/0063748 A1 | 3/2011 | Song et al. |
| 2013/0145093 A1 | 6/2013 | Kaminaga et al. |
| 2013/0286752 A1 | 10/2013 | Michioka et al. |
| 2013/0346671 A1 | 12/2013 | Michael et al. |
| 2014/0258811 A1 | 9/2014 | Liu et al. |
| 2015/0255167 A1* | 9/2015 | Gillingham ............ G11C 16/32 365/185.21 |
| 2016/0034346 A1 | 2/2016 | Michael |
| 2016/0372184 A1 | 12/2016 | Shalvi et al. |
| 2017/0185353 A1 | 6/2017 | Intrater et al. |
| 2018/0090202 A1 | 3/2018 | Kaminaga et al. |
| 2018/0143908 A1 | 5/2018 | Zhang et al. |
| 2020/0125443 A1 | 4/2020 | Hung et al. |
| 2020/0142843 A1 | 5/2020 | Hung |

FOREIGN PATENT DOCUMENTS

| | | |
|---|---|---|
| JP | 2009158015 A | 7/2009 |
| JP | 2013118031 A | 6/2013 |
| TW | 201421238 A | 6/2014 |
| TW | 201830404 A | 8/2018 |
| WO | 0175896 A2 | 10/2001 |

OTHER PUBLICATIONS

EP Extended EP Search Report from Application No. 19200579.1 dated Mar. 10, 2020, 8 pages.

Macronix International Co., Ltd. Technical Note, "Improving NAND Throughput with Two-Plane and Cache Operations," Rev. 1, Nov. 15, 2013, 13 pages.

Micron Technology, Inc. Technical Note "NAND Flash 101: An Introduction to NAND Flash and How to Design it in to Your Next Product," TN-29-19, Rev. B, at least as early as Dec. 2006, 27 pages.

Micron Technology, Inc. Technical Note "NAND Flash Performance Increase Using the Micron Page Read Cache Mode Command," TN-29-01, at least as early as Dec. 2004, 10 pages.

U.S. Office Action in U.S. Appl. No. 16/533,463 dated Jul. 23, 2020, 8 pages.

U.S. Office Action in U.S. Appl. No. 16/544,055 dated Aug. 13, 2020, 22 pages.

JP Office Action in 2019-185125 dated Oct. 19, 2020, 6 pages.

TW Office Action in 10920963630 dated Oct. 7, 2020, 4 pages.

* cited by examiner

PAGE BUFFER STRUCTURE AND FAST CONTINUOUS READ

BACKGROUND

Field

The present invention relates to integrated circuit memory devices, such as NAND flash devices, that support continuous read operations.

Description of Related Art

Read latency, sometimes specified as tR, is the time between receiving a read command and the time at which data requested by the read command is available at the output. This latency can be increased, when the device requires a reset interval, sometimes specified as tRST, between the end of execution of one command, and the beginning of execution of a next command.

This type of latency can be relatively long in NAND flash devices. As a result, NAND flash can be considerably slower than other types of memory, such as NOR flash, for some operations.

Command sequences known as cache read and as continuous read have been developed to address this latency for NAND flash devices.

In the cache read command sequence, the latency can be reduced by overlapping some of the procedures in a pipeline fashion, such as error checking and correcting using a cache or other buffer memory structure on the device. This can improve the throughput of the system using NAND flash. In a continuous command sequence, NAND flash devices have been configured to output sequential pages after the initial latency, so that the sequential pages are available without delay between the pages. Continuous read operations for NAND flash can include three basic steps, as follows:

- (Step 1) Start phase: the host needs to issue page read (C1) command to read out the data of the new page address to the cache. It takes a read latency tR to read out the page data.
- (Step 2) Sequential Continuous read phase: the host reads out the data from the interface on the memory device continuously in this phase.
- (Step 3) End phase: Depending on the read protocol, the host either needs to issue "end" (C3) command (some common NAND Flash devices) or raise the CS from 0 to 1 (SPI NAND Flash devices) to terminate the sequential continuous read operation. It can take a reset latency tRST to terminate the sequential continuous read operation.

Multilevel buffer structures can be used to support pipeline operations to perform fast continuous read operations. However, adding extra buffering levels comes with a penalty in area of the chip, and increased costs of manufacturing.

It is desirable to provide a technology which can support pipelined operations for fast read operations, that requires less area and operates more efficiently.

SUMMARY

A memory device, such as a page mode NAND flash including a page buffer, and an input/output interface for I/O data units having an I/O width less than the page width supports continuous page read with sequential and with non-sequential addresses. The input/output interface can comprise a serial interface (e.g. SPI), or a parallel interface. The page buffer can, as described herein, include multiple levels of buffer latches, facilitating pipeline operation during read operations.

A device is described that includes a memory array including a plurality of bit lines, and a page buffer coupled to the plurality of bit lines having a page width X, an input/output interface, and data path circuits connected between the page buffer and the input/output interface. The page buffer includes a plurality of circuit modules which are operated in a read operation to transfer a page of data from the memory array to latches in the page buffer. In a device described herein, a page buffer circuit module comprises a sensing circuit configured to connect to a bit line in the plurality of bit lines, has a first data output node, and a plurality of levels of buffer latches operable in a pipeline fashion. In a two-level embodiment, the circuit module includes a first-level buffer latch connected via a circuit to latch data from the first data output node in the first-level buffer latch and to output data from the first-level latch to the first data output node in response to first latch timing signals, a data transfer switch connected between the first data output node to a second data output node in response to transfer timing signals, and a second-level buffer latch connected via a circuit to latch data from the second data output node in the second-level buffer latch and to output data from the second-level buffer latch to the second data output node in response to second latch timing signals. Also, a data output switch is connected to the second data output node to a page buffer output, operable to transfer data from the second data output node to the data path circuits on the device.

Also, the device can include error checking and correction ECC circuits connected to the data path circuits. The ECC circuits execute ECC functions on pages in the data path circuits before enabling output of the pages at the input/output interface of the device. The ECC circuits can operate with data chunks having an ECC chunk with less than the page width, and greater than the I/O width.

The data path circuits can include buffer memory including a first part and a second part, and data paths connecting the first part of the buffer memory alternately to the ECC circuits and to the I/O interface, and connecting the second part of the buffer memory alternately to the ECC circuits and to the I/O interface.

Also, the data path circuits can include multilevel buffer memory, including a third buffer level is in addition to the page buffer having multiple levels of buffer latches. The third buffer level can include a first part and a second part, and data paths connecting the first part of the third buffer level alternately to the ECC circuits and to the I/O interface, and connecting the second part of the third buffer level alternately to the ECC circuits and the I/O interface. The first and second parts of the third buffer level can have a buffer width (Y) less than the page width (e.g. a multiple of the width of an ECC chunk), and the data path can have a bus width (Z) less than the buffer width for connecting the first and second parts of the third buffer level alternately to the ECC circuits and to the I/O interface.

Embodiments described herein include a controller that controls continuous page read operations, including continuous page read operations with sequential and non-sequential addresses. A controller in such embodiments controls a continuous page read operation to output a stream of pages at the I/O interface. The continuous page read operation includes responding to a series of commands to output a continuous stream of pages. The series of commands including a first command and a plurality of intra-stream commands received before completing output of a preceding page in the stream, such that intra-stream commands are received and decoded in a manner that can be interleaved with the output of the stream of pages. For non-sequential continuous page read operations, the first command can include an address to initiate the continuous page read operation, and at least one intra-stream command in the plurality of intra-stream commands includes a non-sequential address to provide the non-sequential page in the stream of pages.

A technology is described in which a memory device has a controller that responds to an intra-stream command including in some cases the non-sequential address, by initiating a read to transfer the page to the first-level buffer latches in the page buffer, and by providing the preceding page to the input/output interface in a manner that can be continuous with the last I/O cycle for the intra-stream command including the non-sequential address. Also, the non-sequential page command can follow a preceding page in the stream, where the preceding page has a page address that is included in a preceding intra-stream command in the series of intra-stream commands that precedes the intra-stream command including the non-sequential address by one command in the series of commands. In another embodiment, the non-sequential page can follow the preceding page in the stream, where the preceding page provided to the input/output interface after the intra-stream command including the non-sequential address, has a page address that is carried by a preceding intra-stream command that precedes the intra-stream command including the non-sequential address by two commands in the series of commands.

Examples of the technology are described in which a continuous page read operation can output a stream of pages at the input/output interface, the continuous read operation including transferring a page of data having page width X from the memory array to the first-level buffer latches in the page buffer in a page read interval, transferring the page of data from the first-level buffer latches to the second-level buffer latches in the page buffer, and transferring the page of data from the second-level buffer latches to the input/output interface on the data path circuits.

A method for operating a memory for reading a stream of pages, including optionally non-sequential pages, is described that includes three stages. In a first stage, the method includes moving data of a preceding page from the first-level buffer latches of a page buffer to the second-level buffer latches, and transferring a current page from a memory array to the first-level buffer latches of the page buffer. In a second stage, the method includes moving data of the preceding page from the second-level buffer latches to a third buffer level, and transferring the current page from the first-level buffer latches of the page buffer to the second-level buffer latches. In a third stage, the method includes outputting the current page from the third buffer level by transferring data from a first part of the preceding page from the third buffer level to the interface, and then transferring data from a second part of the preceding page from the third buffer level to the interface. This third stage can include in a manner interleaved with the transferring of the preceding page from the third buffer level, transferring a first part of the current page from the second-level buffer latches to the third buffer level and executing an ECC operation over data in the first part of the page of the current page in the third buffer level in a manner that overlaps in time with transferring the second part of the preceding page to the interface. Also, this third stage can include transferring a second part of the current page from the second-level buffer latches to the third buffer level and executing the ECC operation over data in the second part of the current page in the third buffer level. Also, the method includes transferring the first part of the current page to the input/output interface, overlapping in time with executing the ECC operation over data in the second part of the current page in the third buffer level, and then transferring the second part of the current page to the input/output interface.

A memory device is described herein, such as a page mode NAND flash including a page buffer having multiple levels of buffer latches configured for pipeline operations during a read, and an input/output interface for I/O data units having an I/O width less than the page width which supports fast continuous page read with divided ECC functions to improve throughput for sequential and for non-sequential pages. The input/output interface can comprise a serial interface (e.g. SPI), or a parallel interface.

Embodiments are described in which the memory array comprises a page mode NAND flash. The technologies described herein can be applied to other types of memory devices as well.

Other aspects and advantages of the present invention can be seen on review of the drawings, the detailed description and the claims, which follow.

DETAILED DESCRIPTION

A detailed description of embodiments of the present invention is provided with reference to the FIGS. 1-7.

Figure 1:
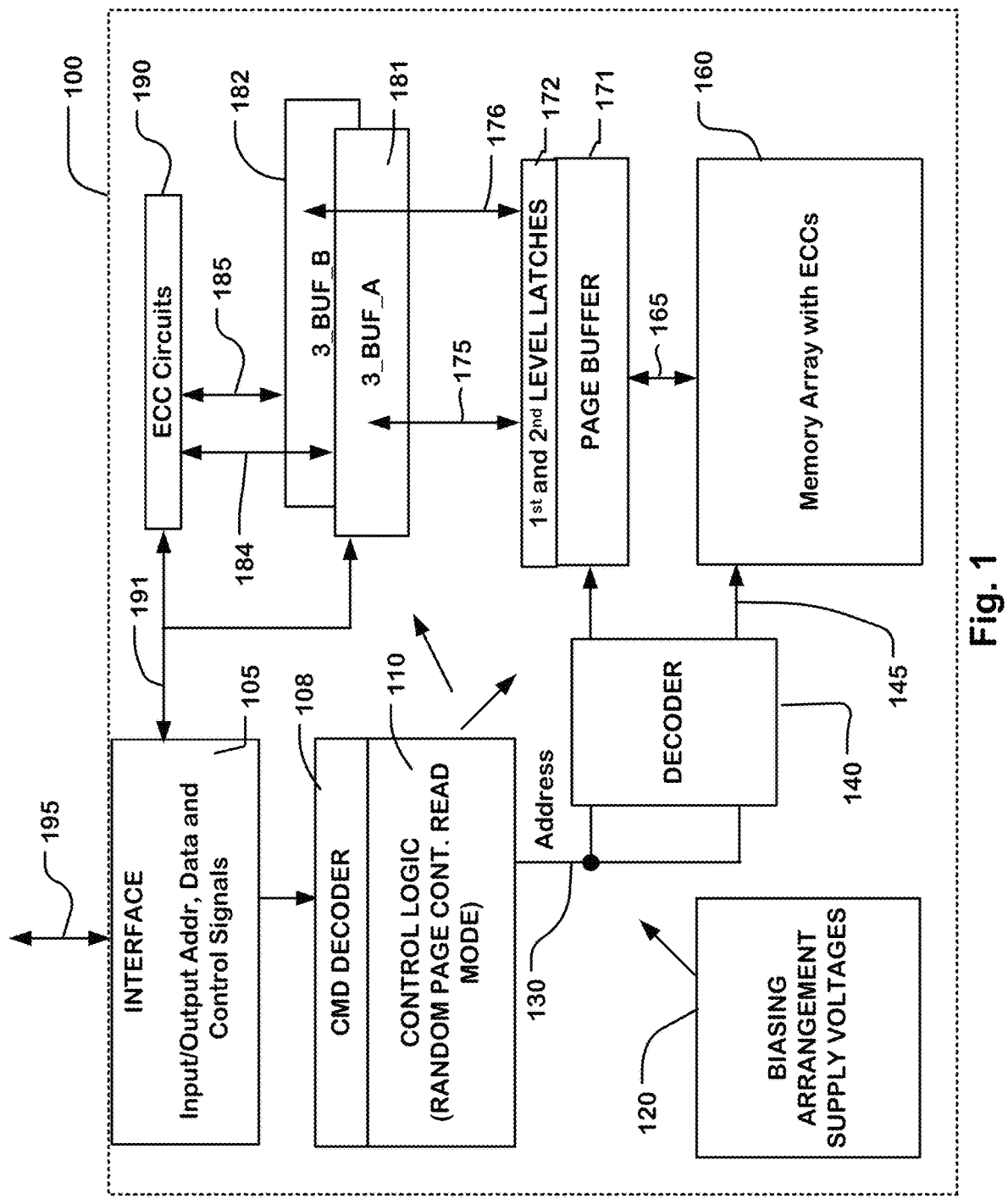
FIG. 1 is a simplified block diagram of an integrated circuit memory device supporting non-sequential page continuous read as described herein.

FIG. 1 is a simplified chip block diagram of an integrated circuit memory device according to an embodiment. The integrated circuit memory device 100 includes a memory array 160 that stores data with ECCs, such as a NAND flash array, on a single integrated circuit substrate. Memory devices as described herein can be implemented using multichip modules, stacked chips and other configurations as well.

Control logic 110 with a command decoder 108, on the integrated circuit memory device 100 includes logic, such as a state machine, responsive to received commands to execute non-sequential and sequential page continuous read operations as described herein, supporting continuous reads with random page addresses as described in more detail below. The control logic 110 outputs control signals, represented by arrows on the diagram, and addresses on bus 130. The addresses applied on bus 130 can include for example outputs of an address counter in the control logic 110, or addresses carried in received commands.

A decoder 140 is coupled to a plurality of word lines 145, and arranged along rows in the memory array with ECCs 160, and to a page buffer 171. The page buffer 171 includes a plurality of circuit modules coupled to a plurality of bit lines 165 arranged along columns in the memory array with ECCs 160 for reading data from and writing data to the memory array with ECCs 160.

The page buffer 171 can includes multiple levels of buffer latches operable in a pipeline fashion during a read, including in this example first and second-level buffer latches 172 for each circuit module in the page buffer. The address decoder 140 can select and couple specific memory cells in the array 160 via respective bit lines to the circuit modules in page buffer 171. The page buffer 171 can store data that is written to or read from these specific memory cells in parallel. The page buffer 171 can have a number of circuit modules equal to a page width for pages including thousands of bits, such as 2K bits or 4K bits, or more, including associated ECC codes. One page can include a plurality of ECC chunks, wherein ECC chunks include a segment of data and an associated ECC code (i.e. having been computed for ECC over the segment of data). In embodiments, each page includes 2 ECC chunks having an ECC width equal to one half page or one fourth page, plus the size of the associated ECC codes. In some embodiments, there may be more than 2 ECC chunks per page.

Data path circuits between the page buffer 171 and the interface 105 include in this embodiment a third buffer level, including two parts designated buffer 3_BUF_A 181 and buffer 3_BUF_B 182 in this example, where each part of the third buffer level can store a part, such as one half, of the contents of the one of the levels of buffer latches page buffer. the part of the contents of the page buffer stored in each part of the third buffer level preferably includes one or more ECC chunks. Also, each part of the third buffer level can be read from and written to independently. In some embodiments, the buffers 3_BUF_A, 3_BUF_B can be implemented using dual-port or multi-port memory technology, allowing independent reads and writes to different addresses, or can be implemented using multiple banks of memory, having separate address decoding and read out circuits.

The page buffer 171 is coupled with the memory array 160 via X data lines where X is a page plus ECC codes width, and with the third level buffers 181, 182 (3_BUF_A, 3_BUF_B) of the buffer structure, via buses 175, 176 of Y bits each, where they can have a width equal to a half width of the page buffer 171. The third level buffers 3_BUF_A, 3_BUF_B can each be implemented with a cache memory using SRAM (static random access memory) memory structures, for example, that have a one row by multiple column architecture. For instance, a page can include 2048 bits+ ECC codes, and 3_BUF_A can have one row with 1024 (+ECC bits) columns or a width of 1024+ECC bits. The buffers 3_BUF_A and 3_BUF_B can be operated so that the page of data in the page buffer can be transferred to the buffers 3_BUF_A and 3_BUF_B in parallel, and in parallel using one buffer memory cycle. Also, the buffers 3_BUF_A and 3_BUF_B can be operated so that the one part of the page of data in the page buffer can be transferred to each one of the buffers 3_BUF_A and 3_BUF_B in parallel, allowing the transfer of a first part of the page to a first part (e.g. 3_BUF_A) of the third buffer level, and the transfer of a second part of the page to a second part (e.g. BUF_A) of the third buffer level in the same or different buffer memory cycles.

Other embodiments can include two-level buffer structures (omitting the third buffer level) or more than three level buffer structures.

Error checking and correction ECC circuits 190 are coupled to the buffer memory structure (181, 182) by data bus 184 and data bus 185. The data buses 184 and 185 can have a bus width less than an ECC chunk, such as one byte or one word, and are used by the ECC circuits 190 to cycle through ECC chunks to perform ECC operations of error checking and error correction (e.g. syndrome calculation, key calculation, Chien search). The ECC circuits are coupled by data bus 191 to the buffer memory structure (181, 182) for movement of data back and forth as necessary.

An I/O interface 105 is coupled to the ECC circuits and to the buffer memory structure (181, 182) by data bus 191.

Input/output data and control signals are moved among the interface 105, the command decoder 108, and the control logic 110, and input/output ports 195 on the integrated circuit memory device 100, or other data sources internal or external to the integrated circuit memory device 100. In some embodiments, the ports 195 can connect to on-chip host circuits, such as a general purpose processor or special purpose application circuitry, or a combination of modules providing system-on-a-chip functionality supported by the memory array 160.

In one embodiment, the interface 105 is a serial interface including a set of I/O ports 195 through which commands, addresses and data are communicated. The serial interface can be based on a Serial Peripheral Interface (SPI) bus specification in which the command channel shares the I/O pins used by address and data. For example, the integrated circuit memory device 100 can include input/output ports using pins for receiving and transmitting SPI bus signals. One pin can be connected to an input data line carrying serial input data/address signal SI, usable for commands as well. Another pin, or multiple other pins, can be connected to an output data line or output data lines carrying serial output data signal SO. Another pin can be connected to a clock line carrying serial clock signal SCLK. Yet another pin can be connected to a control line carrying chip-enable or chip-select signal CS #. Other types of interfaces, including parallel interfaces can be used as well. The I/O ports 195 on a particular integrated circuit memory device 100 can be configured to provide output data with an I/O data width, which can be, for some examples, 1, 4, 8, 16, 32 or more bits in parallel per interface clock (e.g. SCLK) cycle. The I/O interface 105 can include a FIFO buffer, a shift register buffer or other supporting circuits along with a transmitter for transmitting data received at the interface on ports at a port clock rate, such as an SCLK rate for an SPI interface.

In the example shown in FIG. 1, control logic 110 using a bias arrangement state machine controls the application of bias arrangement supply voltage generated or provided through the voltage supply or supplies in block 120, such as read, program and erase voltages including page read, to transfer data from a page in the memory array to the page buffer, including generation of timing signals utilized for pipeline operations of the multi-level buffer structure. The control logic 110 is coupled to the page buffer, the data path circuits including the third-level buffer, the ECC circuits 190, and the memory array with ECCs 160.

The control logic 110 and command decoder 108 constitute a controller which can be implemented using special purpose logic circuitry including state machines and supporting logic. In alternative embodiments, the control logic comprises a general-purpose processor, which can be implemented on the same integrated circuit, which executes a computer program to control the operations of the device. In yet other embodiments, a combination of special-purpose logic circuitry and a general purpose processor can be utilized for implementation of the control logic.

The command decoder 108 and control logic 110 of the controller can be configured to execute a continuous read operation for non-sequential pages, allowing a shift during a continuous read to random page addresses. In embodiments described herein, the controller is responsive to the commands received at the input/output interface, to control memory operations including a continuous page read operation to output a stream of pages at the I/O interface. The execution of a continuous read operation includes responding to a series of commands, the series including a first command, and to a plurality of intra-stream commands, where the intra-stream commands are defined herein as commands after the first command and received before completing output of a preceding page in the stream. In embodiments described, the first command includes an address to initiate the continuous page read operation, and at least one intra-stream command in the plurality of intra-stream commands including a non-sequential address for a non-sequential page in the stream of pages to provide the non-sequential page in the stream of pages.

Figure 2:
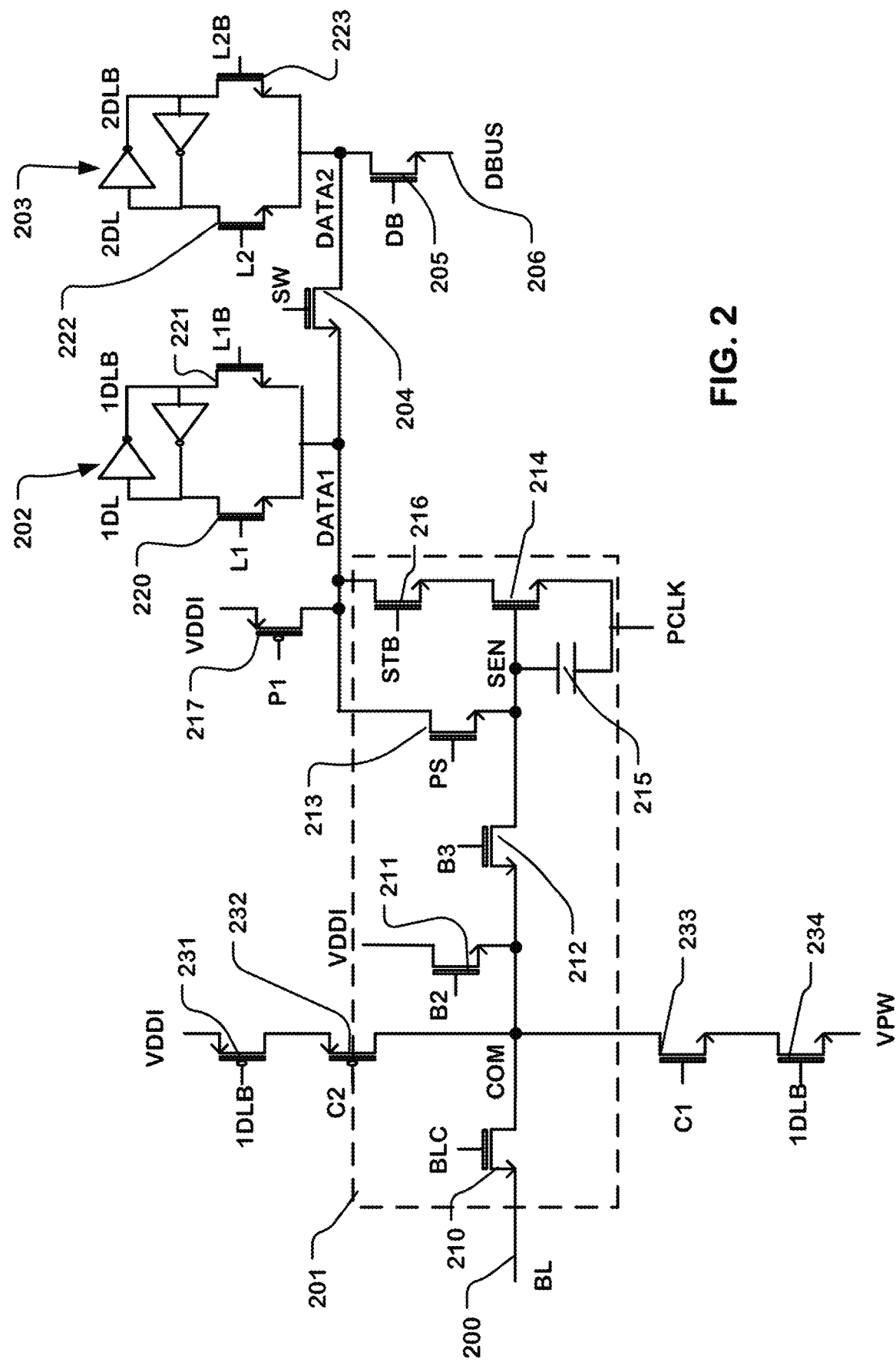
FIG. 2 is a circuit diagram of a page buffer with multiple levels of buffer latches operable in a pipeline fashion during a read.

FIG. 2 is a circuit diagram of an example of a circuit module of a page buffer having multiple levels of buffer latches operable in a pipelined fashion during a read operation, such as the page buffer 171 including first-level and second-level buffer latches 172 of FIG. 1. A page buffer can include a plurality of circuit modules like that of FIG. 2, supporting page mode read and program operations.

The circuit module is configured to be operably coupled to a bit line 200, by direct connection or by connection through a decoding circuitry for example. The bit line 200 is applied as input to a sensing circuit 201 having a data output, connected to a first data output node DATA1. The sensing circuit 201 is suitable for use with NAND flash memory in this example.

The circuit module includes a first-level buffer latch 202 connected to the first data output node DATA1. Transistor 204 having its gate connected to a timing signal SW is connected as a switch between the first data output node DATA1 and a second data output node DATA2. A second-level buffer latch 203 is connected to the second data output node DATA2. The transistor 205 having its gate connected to a timing signal DB is connected as a switch between the second data output node DATA2 and a connection DBUS 206 on data path circuits including a third-level buffer in the example of FIG. 1, to the input/output interface of the device. Connection DBUS 206 can be connected to a data bus, such as bus 175 or bus 176 of FIG. 1. Because transistor 204 can be turned off to separate first-level buffer latch 202 from second-level buffer latch 203, data from second-level buffer latch 203 can be transferred to the third level buffer (e.g., 3_BUF_A, 3_BUF_B in FIG. 1) via the DBUS line 206, while data from the sensing circuit 201 is transferred to the first-level buffer latch 202.

The sensing circuit 201 in this example is connected to bit line 200 by transistor 210 having its gate connected to a timing and control signal BLC. Transistor 210 can be operated as a bit line clamp transistor during a read operation, and connects the bit line 200 to a node COM.

A bias circuit including transistors 231-234 is connected to the node COM operated during program operations, for example. This circuit may be off during a read operation in some examples. The bias circuit is responsive to a data value (in this example 1DLB) stored in the first-level buffer latch 202. P-channel transistor 231 and p-channel transistor 232 are connected in series between a bias voltage VDDI and the node COM. N-channel transistor 233 and n-channel transistor 234 are connected in series between a bias voltage VPW and the node COM. Transistors 232 and 233 are controlled by timing signals C1 and C2. Transistors 231 and 234 have their gates connected to the data value 1DLB stored in the first-level buffer latch 202.

Transistor 211 is connected between a bias voltage VDDI and node COM, having its gate connected to a signal B2 that controls timing and a magnitude of current applied to the transistor 211 and to the node COM.

The node COM is connected by transistor 212 to a node SEN. The gate of transistor 212 is connected to a signal B3 that controls transfer timing of the voltage on node COM to node SEN.

The node SEN is connected in this example by n-channel transistor 213 to the first data output node DATA, which is in turn connected by p-channel transistor 217 to bias voltage VDDI. Transistor 213 has its gate connected to signal PS, and transistor 217 has its gate connected to signal P1 which, in combination, are operable to control the timing and charging of the node SEN for a read operation.

The node SEN is connected to the gate of n-channel transistor 214. The source of transistor 214 is connected to a node configured to receive a clock signal PCLK. The drain of transistor 214 is connected in series with n-channel transistor 216 to the first data output node DATA1. Transistor 216 has its gate connected to a signal STB. The node SEN is connected via capacitor 215 to the node receiving the clock signal PCLK.

The transistors 220 and 221 provide a circuit for connection of the first data output node DATA1 to the first-level buffer latch 202, to latch data on the node DATA1 or to provide data from the latch 202 to the node DATA1. The transistors 220 and 221 are controlled by the signals L1 and L1B, which control the timing of the connection of the latch to the node DATA1.

Transistors 222 and 223 provide a circuit for connection of the second data output node DATA2 to the second-level buffer latch 203, to latch data on the node DATA2 or to provide data from the latch 203 to the node DATA2. The transistors 222 and 223 are controlled by the signals L2 and L2B, which control the timing of the connection of the latch to the node DATA2.

In operation, data on a selected memory cell is transferred from the memory array via the bit line 200 to the sensing circuit 201, which develops a data value for the memory cell on the first data output node DATA1. Basically, the node SEN is precharged in response to the control signals PS and P1. The selected memory cell is accessed and the transistors 210 and 212 are operated to connect the bit line 202 to the node SEN. Then the node SEN is isolated from the bit line by controlling the transistor 212, and holds a voltage that represents the sensed data value. The signal PLCK is then dropped to ground, for example, and the STB signal is operated to turn on transistor 216. Transistor 214 turns on or remains off, based on the voltage across the capacitor 215, thereby developing a voltage at the first data output node DATA1.

The timing signals L1 and L1B are operated to cause the data on the first data output node DATA1 to be latched in the first-level buffer latch 202, completing transfer of the data value from the memory array to the first-level buffer latch 202.

For a continuous read, the transistor 204 is operated in coordination with the timing signals L1, L1B, L2 and L2B to transfer the data value from the first-level buffer latch 202 to the second-level buffer latch 203, and in a pipelined fashion, the sensing of a next data value using the sensing circuit 201 can begin.

In a next pipeline stage, the control signals L2 and L2B are operated in coordination with the signal DB and provide the data value in the second-level buffer latch 203 to the data bus via line DBUS 206, for storage in a third-level buffer, for example.

The various signals for control and timing of transistors in the circuit modules in a multilevel page buffer like that of FIG. 2 are provided by timing and control circuits in the control logic 110 and command decoder 108, which can comprise a state machine invoked on decoding a read command, including continuous page read commands.

In the embodiment shown in FIG. 2, there are two levels of buffer latches supporting single-bit-per-cell operations. In other embodiments, multiple-bit-per-cell operations can be supported using a plurality of first-level buffer latches and a plurality of second-level buffer latches in each circuit module.

Figure 3:
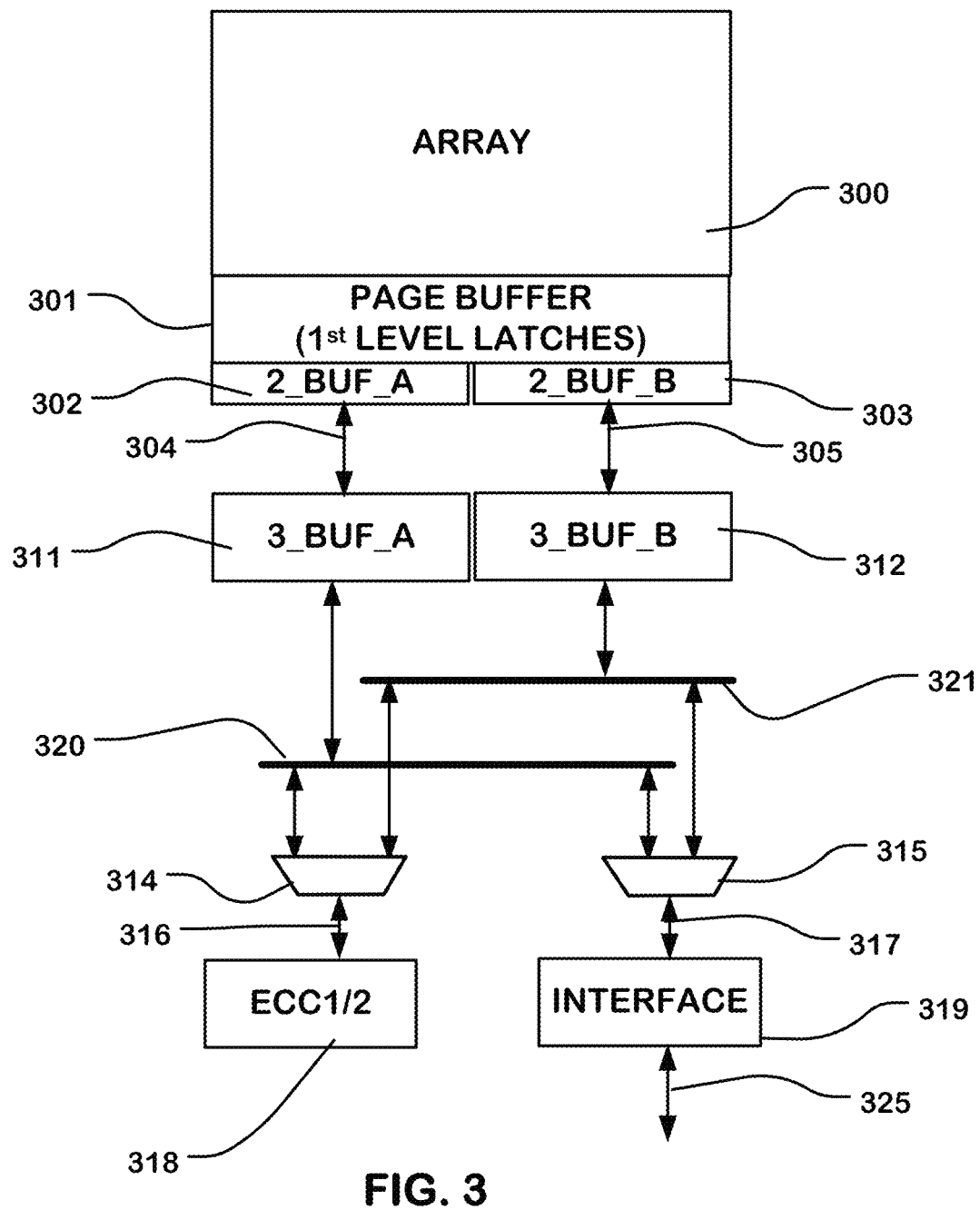
FIG. 3 is a block diagram showing three-level buffering for a device supporting fast continuous and non-sequential page continuous read as described herein, with ECC.

FIG. 3 is a block diagram illustrating a memory array, and data path circuitry including ECC circuits operable for sequential and non-sequential page continuous reads as described herein with three-level buffering (first-level buffer latches/second-level buffer latches/buffer 3_BUF_A, buffer 3_BUF_B). This is an example of a circuit organization that can be utilized for example in the integrated circuit memory device 100 of FIG. 1. The third buffer level can be implemented using SRAM and cache technologies as discussed above in connection with FIG. 1.

In FIG. 3, a memory array 300, such as a NAND flash array, is coupled to a page buffer 301. Data can move from the memory array 300 to the first-level buffer latches in page buffer 301 in parallel during a single read operation. The page buffer 301 includes second-level buffer latches, including a first set 2_BUF_A (302) and a second set 2_BUF_B (303).

The first set 2_BUF_A 302 are coupled to a first part of the third level buffer, buffer 3_BUF_A (311), by a data bus 304 that can have the same width as the first set 2_BUF_B (i.e. one half of the page) enabling transfer of data from buffer 2_BUF_A to buffer 3_BUF_A in a single cycle. Likewise, the set of second-level buffer latches 2_BUF_B is coupled to buffer 3_BUF_B (312) by a data bus 305 that can have the same width (i.e. one half of the page) 2_BUF_B, enabling transfer of data from the second part of the second-level buffer latches 2_BUF_B to buffer 3_BUF_B in one cycle. In some embodiments, the second-level buffer latches can be configured in a single set having the same width as the first-level buffer latches, and may include a single buffer structure rather than a structure having separated access lines on the side of the third buffer level, as illustrated here.

As illustrated, the data path circuits include a bus 320 connected to buffer 3_BUF_A, and a bus 321 connected to buffer 3_BUF_B. The bus 320 is connected to a multiplexer 314 and to a multiplexer 315. Likewise, the bus 321 is connected to the multiplexer 314 and to the multiplexer 315. The output of the multiplexer 314 is connected by line 316 to the ECC circuits 318. The output of the multiplexer 315 is connected by line 317 to the I/O interface 319, which provides the output data for the addressed pages on ports 325. Data can be moved on the bus 320 and the bus 321 by addressable units such as bytes or words that are supportable by the buses 320, 321, for use by the ECC circuits 318 and for output by the interface 319 on ports 325. The ECC circuit 318 can include first ECC function circuits, and second ECC function circuits which can be utilized alternatively using the buffer 2_BUF_A/buffer 2_BUF_B; buffer 3_BUF_A/ buffer 3_BUF_B structures. In some embodiments, the bus 320 and the bus 321 can be coupled to both the output of the page buffer and third buffer levels.

Figure 4:
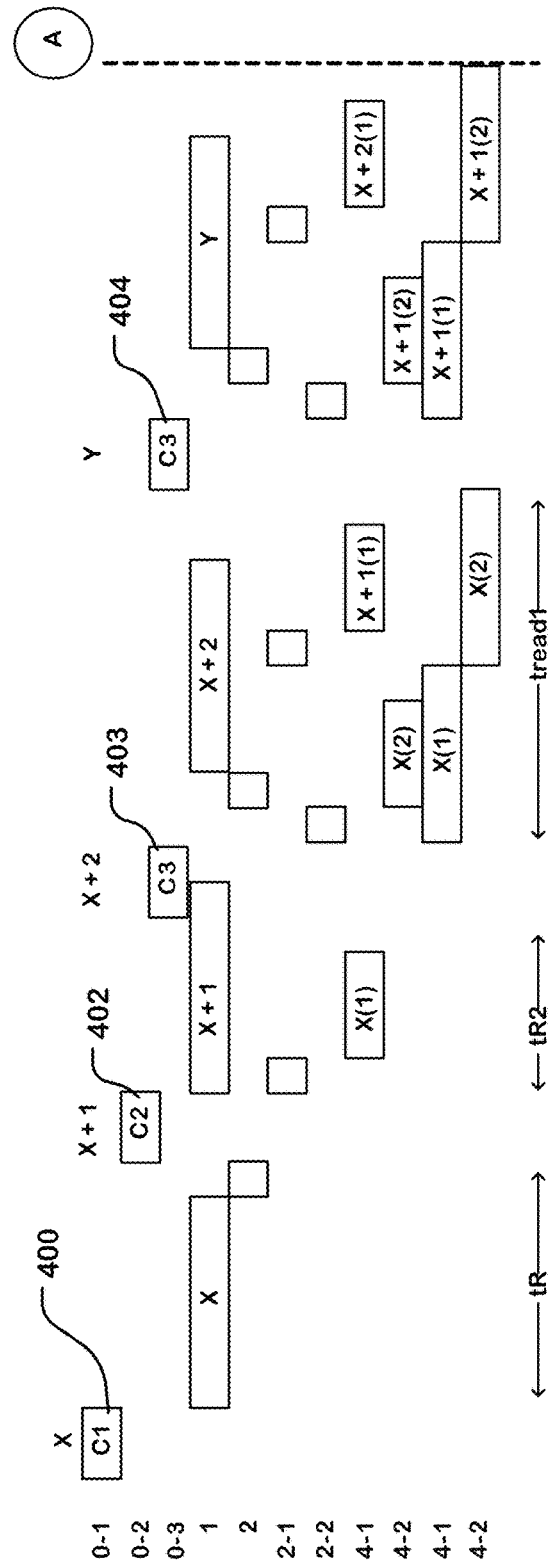
FIG. 4 is a pipeline dataflow diagram for one embodiment of a non-sequential page continuous read as described herein with three-level buffering.
Figure 4:
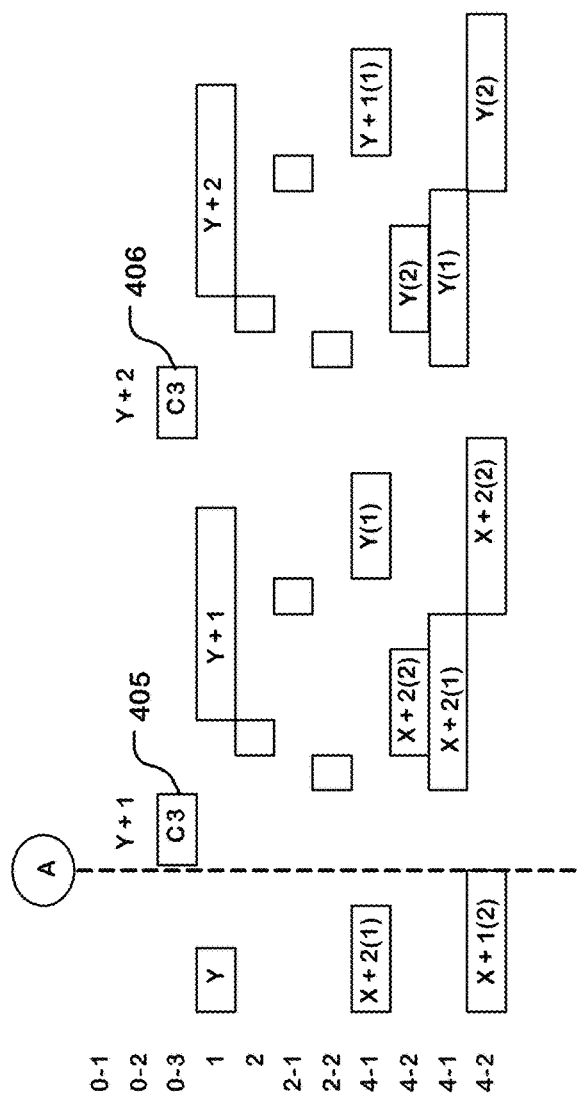

In a three-level buffering system like that of FIG. 3, a three-stage non-sequential page continuous read operation like that shown in FIG. 4 can be executed, enabling use of a higher-speed output clock on the I/O interface for example.

FIG. 4 illustrates a non-sequential page continuous read operation for a three-level buffering system. FIG. 4 includes two levels. The upper level illustrates a series of commands for a non-sequential page continuous read. The lower level indicates operation of the first-level buffer latches of the page buffer during execution of the non-sequential page continuous read.

In the example of FIG. 4, the non-sequential continuous read is initiated by receiving a first command in interval 400 at the I/O interface. The first command C1 indicates a continuous read, and provides a starting address of page X. In response to decoding of the command C1, the array is operated to read page X during interval 401, and page X data becomes available in the first-level buffer latches during interval 402. After the read latency tR, during which the data of page X is loaded into the first-level buffer latches from the memory array, an intra-stream command C2 is received during interval 403 using the I/O interface. In this example, the next page address is carried with the intra-stream command C2 indicating page X+1. The preceding page is the initial page, page X. After receiving the intra-stream command C2 during the interval 403, the memory is operated to load the data of page X+1 into the first-level buffer latches in interval 405. Meanwhile, the data of page X is moved through the data path circuits (e.g., second-level buffer latches, buffer 3_BUF_A, buffer 3_BUF_B). After a second latency tR2 allowing for movement of the data through the three-level data path circuits, a second intra-stream command C3 (cache read) is received in interval 404 using the I/O circuits. The second intra-stream command C3 carries a next page address in the non-sequential continuous page operation, which in this example is page X+2 and is sequential with the preceding page. Meanwhile, the data of page X+1 is moved into the first-level buffer latches of the page buffer in interval 405. After the second intra-stream command C3, a cache read operation is executed providing the data of page X on the I/O interface in interval 406. At the end of interval 406, a next intra-stream command C3 (cache read) is received on the I/O interface in interval 408 including the next address (page Y) and outputting the data of page X+1, which was addressed with a command received two commands before the current command.

In this example, the next address carried in the cache read intra-stream command of interval 408 is non-sequential page Y. While the data of page X+1 is output on the interface, the data of the next page X+2 is loaded into the first-level buffer latches of the page buffer in interval 407 and begins traversing the data path circuits. The data of page Y is loaded into the first-level buffer latches during interval 409. Thus, the next command C3 can carry the address of page Y+1, and the data of page Y+1 can be loaded into the first-level buffer latches during interval 411.

As illustrated in FIG. 4, to output the next page, a next intra-stream command (cache read) including the next page address (e.g. page Y+1) is provided continuous with the output on the I/O interface of a preceding page in the stream of pages (e.g. page X+1). In this example, the preceding page has a page address included in a preceding intra-stream command in the plurality of intra-stream commands that precedes said intra-stream command including the non-sequential address by two commands in the series of commands.

This procedure is continued until a first termination command C4 is received in interval 410, in this example terminating after the cache read intra-stream command that carries the address of page Y+1. The termination intra-stream command C4 need not carry a next address. At the time of interval 410, page Y is output, while page Y+1 remains in the data path circuits. In this example a second termination intra-stream command C4 is provided in interval 412 to read the data of page Y+1 from the buffer circuits.

FIG. 4 is pipeline data flow for yet another embodiment of a non-sequential page continuous read utilizing data path circuitry having three buffer levels like that of FIG. 3, in which throughput can be improved using three command levels. In the diagram, the horizontal axis represents time, each vertical level corresponds to a particular data movement as follows:

0-1: host issues and controller receives first page read command C1 for a first page.

0-2: host issues and controller receives intra-stream continuous page read command C2 with address for second page 0-3: host issues and controller receives intra-stream continuous page read command C3 with page address with next succeeding page address 1: move the page data and ECCs from the memory array to the first level buffer latches in page buffer (both halves).

2: move the page data from the first level buffer latches to the second level buffer latches BUF_2_A and buffer BUF_2_B in page buffer.

3-1: move the data from the first half of the page in second level buffer latches BUF_2_A to buffer BUF_3_A.

3-2 move the data from the second half of the page in second level buffer latches BUF_2_B to buffer BUF_3_B.

4-1: apply ECC logic for error detection and correction in buffer BUF_3_A.

4-2: apply ECC logic for error detection and correction in buffer BUF_3_B.

5-1: move the data from buffer BUF_3_A to the data path in the I/O interface.

5-2: move the data from buffer BUF_3_B to the data path in the I/O interface.

In this pipeline flow, implemented using a state machine and supporting logic in the controller for the device, a first read command C1 400 is received carrying address X, and then after a latency tR, a second continuous read command C2 402 carrying address X+1 is received. In this way, the array is not accessed for page X+1 until the command C2 402 is received and decoded. Thereafter, the host waits for latency tR2, and issues a third continuous read command C3 403 carrying a next address for the stream. The command C3 can be issued again at times 404, 405 and 406 by the host with the interval tread1 between commands, even for non-sequential addresses, and obtain the next address for the stream until termination.

Figure 5:
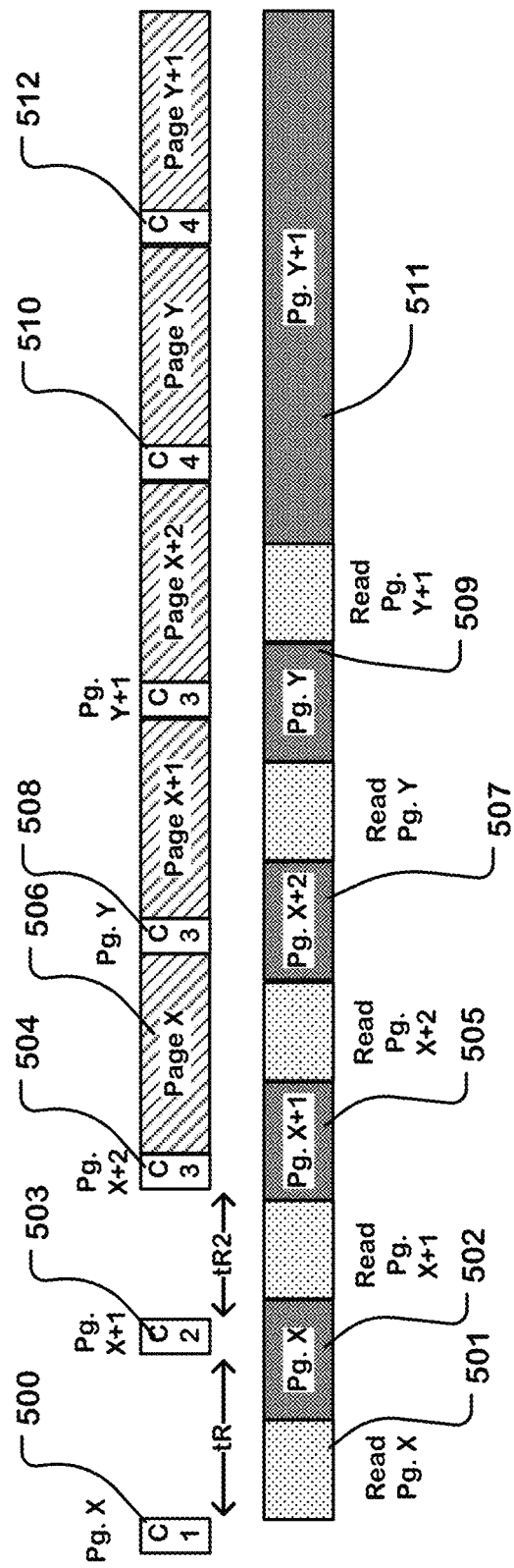
FIG. 5 is a diagram of a command sequence for non-sequential page continuous read as described herein.

FIG. 5 illustrates a data flow for an embodiment, like the embodiment of FIG. 4, of a non-sequential page continuous read operation for a three-level buffering system. FIG. 5 includes two levels. The upper level illustrates a series of commands for a non-sequential page continuous read. The lower level indicates operation of the first level buffer latches of the page buffer during execution of the non-sequential page continuous read.

In the example of FIG. 5, the non-sequential continuous read is initiated by receiving a first command in interval 500 at the I/O interface. The first command C1 initiates a continuous read, and provides a starting address of page X. In response to decoding of the command C1, the array is operated to read page X during interval 501, and page X data becomes available in the first level buffer latches page buffer during interval 502. After the read latency tR, during which the data of page X is loaded into first level buffer latches in the page buffer from the memory array, an intra-stream command C2 is received during interval 503 using the I/O interface. In this example, the next page address is carried with the intra-stream command C2 indicating page X+1, before the array is accessed for the next page in the sequence. After receiving the intra-stream command C2 during the interval 503, the memory is operated to load the data of page X+1 into the first level buffer latches in interval 505. Meanwhile, the data of page X is moved through the data path circuits (e.g., buffer BUF_2_A, buffer BUF_2_B, buffer BUF_3_A, buffer BUF_3_B). After a second latency tR2 allowing for movement of the data through the three-level data path circuits, a second intra-stream command C3 (cache read) is received in interval 504 using the I/O circuits. The second intra-stream command C3 carries a next page address in the continuous page operation, which in this example is page X+2 and is sequential with the preceding page. Meanwhile, the data of page X+1 is moved into the first level buffer latches in interval 505. After the second intra-stream command C3, a cache read operation is executed providing the data of page X on the I/O interface in interval 506. At the end of interval 506, a next intra-stream command C3 (cache read) is received on the I/O interface in interval 508 including the next address (page Y), before the array is accessed for the next page in the sequence, and outputting the data of page X+1 begins, which was addressed with a command at interval 503 received two commands before the current command.

In this example, the next address carried in the cache read intra-stream command of interval 508 is non-sequential page Y. While the data of page X+1 is output on the interface, the data of the next page X+2 is loaded into the first level buffer latches in interval 507 and begins traversing the data path circuits. The data of page Y is loaded into the first level buffer latches during interval 509. Thus, the next command C3 can carry the address of page Y+1, and the data of page Y+1 can be loaded into the first level buffer latches during interval 511.

As illustrated in FIG. 5, between outputting of pages, a next intra-stream command C3 (cache read) including the next page address (e.g. page Y+1) is provided continuous with the output on the I/O interface of a preceding page (by two pages) in the stream of pages (e.g. page X+1). In this example, the preceding page has a page address included in a preceding intra-stream command in the plurality of intra-stream commands that precedes said intra-stream command including the non-sequential address by two commands in the series of commands.

This procedure is continued until a first termination command is received (not shown).

Figure 6:
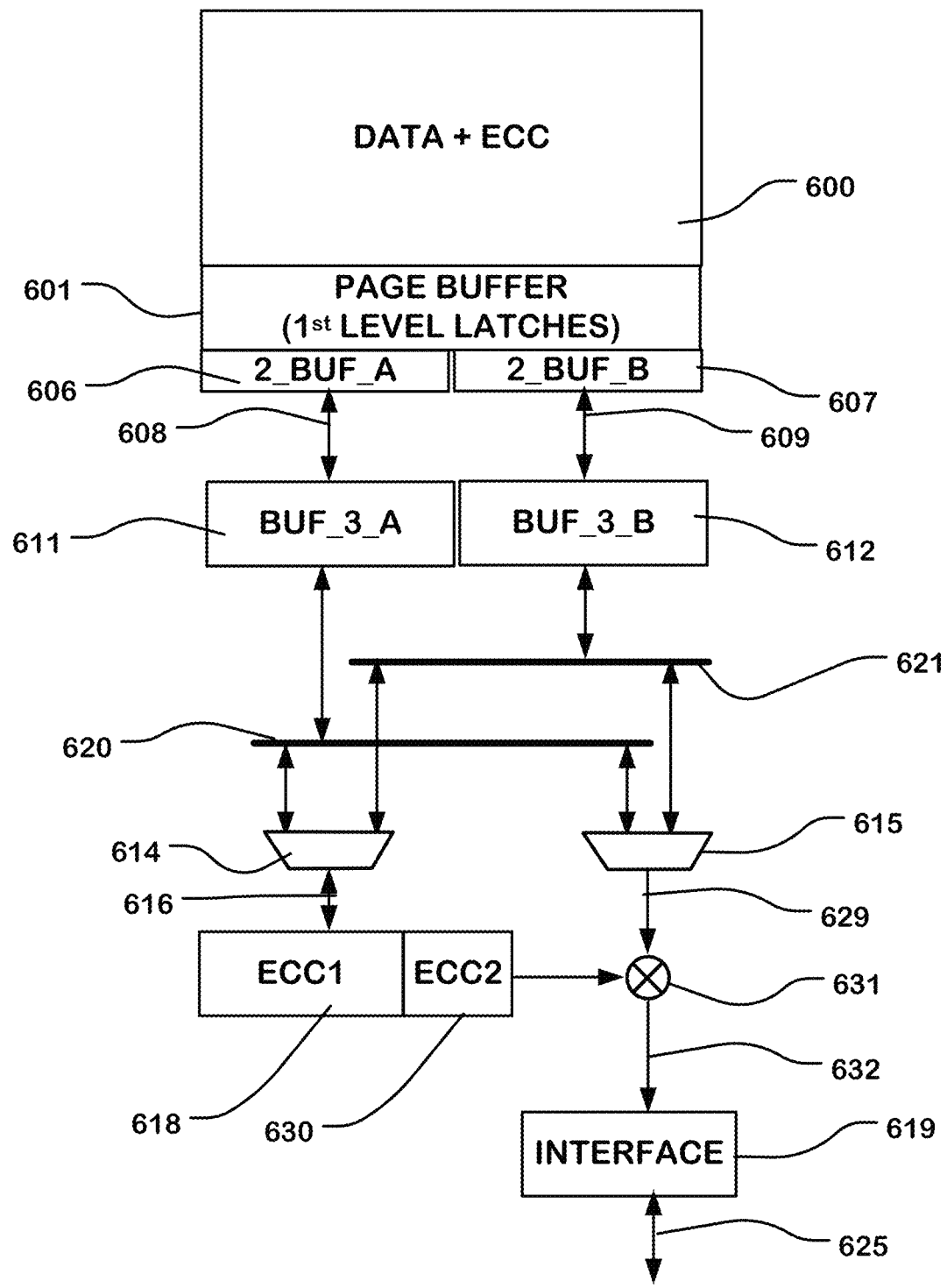
FIG. 6 is a block diagram showing three-level buffering for a device supporting fast page continuous read operations with divided ECC functions.

FIG. 6 is a block diagram illustrating a memory array, and data path circuitry including ECC circuits operable for fast continuous reads operations, including sequential and non-sequential reads, with three-level buffering (first-level buffer latches/second-level buffer latches 2_BUF_A, buffer 2_BUF_B/buffer 3_BUF_A, buffer 3_BUF_B). This is another example of a circuit organization that can be utilized for example in the integrated circuit memory device 100 of FIG. 1. The third buffer levels can be implemented using SRAM and cache technologies as discussed above in connection with FIG. 1.

In FIG. 6, a memory array 600, such as a NAND flash array, is coupled to a page buffer 601. Data can move from the memory array 600 to the first-level buffer latches in page buffer 601 in parallel during a single read operation. The data can move from the first-level buffer latches of page buffer 601 to the second-level buffer latches in a single parallel operation, or in other combinations of data transfers. The second-level buffer latches have first and second parts in this example, including a first set of second-level buffer latches 2_BUF_A (606) and a second set of second-level buffer latches 2_BUF_B (607).

The first and second sets of second-level buffer latches are coupled to the third-level buffer including two parts in this example, buffer 3_BUF_A, buffer 3_BUF_B. In this example, buffer 3_BUF_A (611), is connected by a data path 608 that can have the same width (e.g. one half of the page plus ECCs) the first set of second-level buffer latches enabling transfer of data from 2_BUF_A to buffer 3_BUF_A in a single cycle. Likewise, second set of second-level buffer latches 2_BUF_B is coupled to buffer 3_BUF_B (612) by a data path 609 that can have the same width (e.g., one half of the page plus ECCs), enabling transfer of data from 2_BUF_B to buffer 3_BUF_B in one cycle. Also, embodiments of the third buffer level can include more than two parts.

As illustrated, the data path circuits include a bus 620 connected to buffer 3_BUF_A, and a bus 621 connected to buffer 3_BUF_B. The bus 620 is connected to a multiplexer 614 and to a multiplexer 615. Likewise, the bus 621 is connected to the multiplexer 614 and to the multiplexer 615. Data can be moved on the bus 620 and the bus 621 by bus width Z addressable units such as bytes or words that are supportable by the buses 620, 621, for use by the ECC circuits 618 and 630, for output by the interface 619 on ports 625.

The output of the multiplexer 614 is connected by line 616 to the ECC circuits including circuits 618 for a first ECC function ECC1, such as syndrome calculation and key calculation and for a second ECC function ECC2, such as Chien search.

The buffer data bus system operable to connect the ECC circuits to each of the first and second parts of the third buffer level for execution of the first ECC function, and to connect each of the first and second parts of the third buffer level (via combinational logic) for the second ECC function to the input/output interface has a bus system having the bus width Z in this example. The first ECC function includes operating on data of width Z sequentially over data in selected one of the first and second parts of the third buffer level, and the second ECC function includes modifying data of width Z in transit from a selected one of the first and second parts of the third buffer level to the input/output interface in the illustrated example.

The output of the multiplexer 615 is connected by line 629 to combinational logic 631, having an output connected by line 632 to the I/O interface 619. A second input to the combinational logic 631 includes error correction data from the second ECC function ECC2 in circuits 630. The combinational logic can comprise logic gates that combine the data on bus 621 with error correction data to provide error corrected data on line 632.

Figure 7:
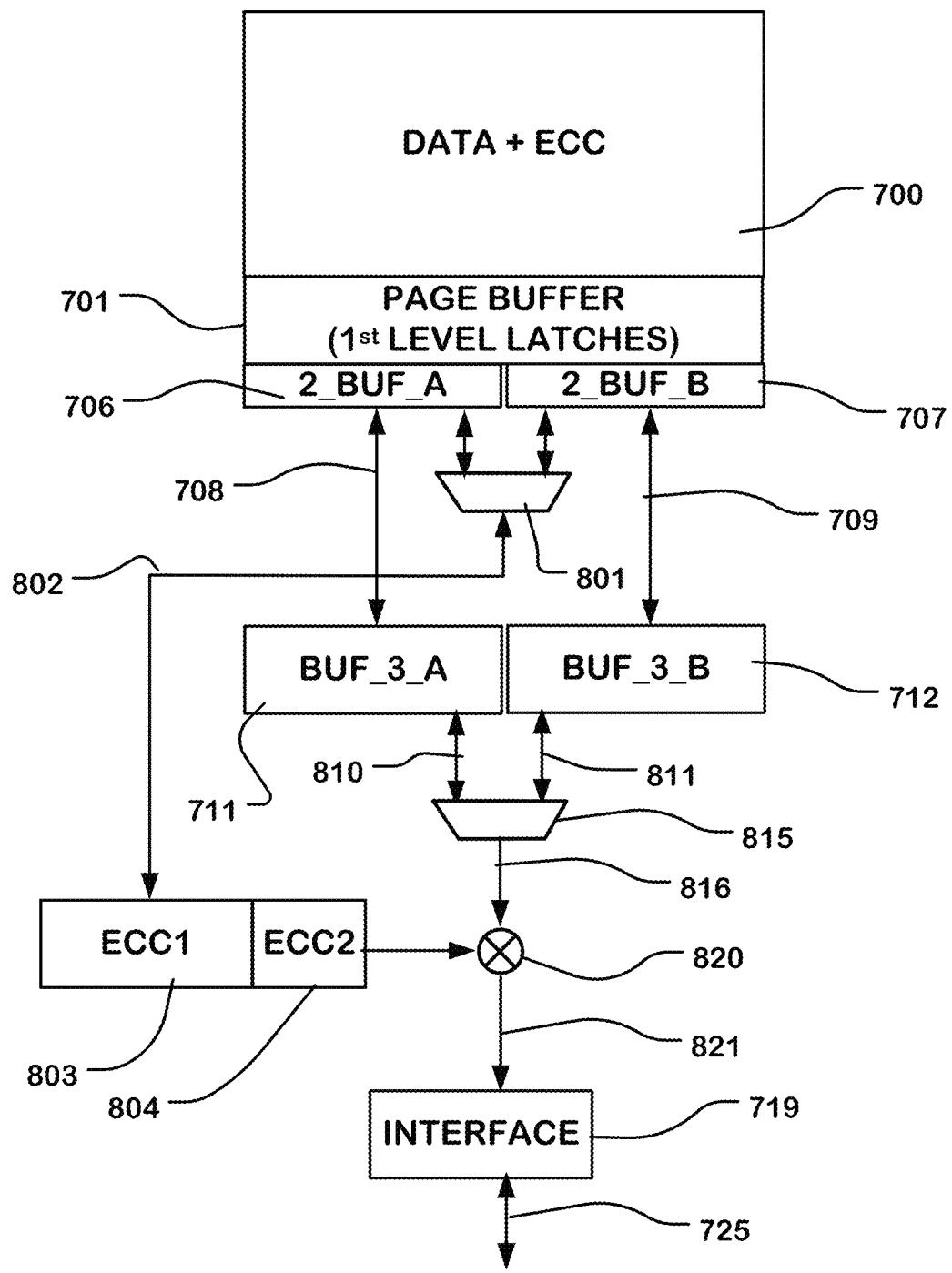
FIG. 7 is a block diagram showing three-level buffering for a device supporting fast page continuous read operations with divided ECC functions.

FIG. 7 is a block diagram illustrating a memory array, and data path circuitry including ECC circuits operable for fast continuous reads operations, including sequential and non-sequential reads, with three-level buffering (first-level buffer latches/second-level buffer latches 2_BUF_A, buffer 2_BUF_B/buffer 3_BUF_A, buffer 3_BUF_B). This is another example of a circuit organization that can be utilized for example in the integrated circuit memory device 100 of FIG. 1, with an alternative arrangement for providing access to the second-level buffer latches, which flexibility can be used in many settings in addition to the split ECC setting described here. The third buffer levels can be implemented using SRAM and cache technologies as discussed above in connection with FIG. 1.

In FIG. 7, a memory array 700, such as a NAND flash array, is coupled to a page buffer 701. Data can move from the memory array 700 to the first-level buffer latches in page buffer 701 in parallel during a single read operation. The data can move from the first-level buffer latches of page buffer 701 to the second-level buffer latches in a single parallel operation, or in other combinations of data transfers. The second-level buffer latches have first and second parts in this example, including a first set of second-level buffer latches 2_BUF_A (706) and a second set of second-level buffer latches 2_BUF_B (707).

In the embodiment shown in FIG. 10, the first and second sets of the second-level buffer latches 2_BUF_A/buffer 2_BUF_B 706, 707 are connected to multiplexer 801, the output of which is connected by line 1002 to the first ECC function circuits 1003. Also, the first and second parts 711, 712 of the third-level buffer 3_BUF_A/buffer 3_BUF_B are connected to multiplexer 815 by lines 810 and 811, respectively, the output of which is provided on line 816 to the combinational logic 820, the output of which is connected by line 821 to the interface 719.

The ECC circuit includes first ECC function circuits 803, and second ECC function circuits 804. The first ECC function circuits 803 can be utilized alternatively using the second-level buffer latches 2_BUF_A/buffer 2_BUF_B under the control of a state machine or other control logic in a controller on the device to produce correction data. The second ECC function circuits 804 are coupled to the combinational logic 820 to provide the correction data for combination with the corresponding page in transit to the interface from the corresponding part of the third-level buffer. Using a structure like that of FIG. 7, the ECC operation can be split, using the second-level buffer for a first part of the operation, and the third-level buffer for the final part of the operation.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
   a memory array including a plurality of bit lines;
   a page buffer including a plurality of circuit modules configured for connection to the plurality of bit lines;
   an input/output interface; and data path circuits connected between the page buffer and the input/output interface; wherein a circuit module in the plurality of circuit modules comprises
   a sensing circuit configured to connect to a bit line in the plurality of bit lines, and having a first data output node;
   a first-level buffer latch connected via a circuit to latch data from the first data output node in the first-level buffer latch and to output data from the first-level buffer latch in response to signals that control a first latch timing;
   a second-level buffer latch connected via a circuit to latch data from the first-level buffer latch in the second-level buffer latch and to output data from the second-level buffer latch in response to signals that control second latch timing; and
   a data output switch connected to the second-level buffer latch and to a page buffer output, operable to transfer data from the second-level buffer latch and to the data path circuits; and
a controller responsive to commands received at the input/output interface, to control memory operations including a continuous page read operation to output a stream of pages at the input/output interface, the continuous read operation including responding to a series of commands, the series including a first command to start the continuous page read operation by which pages are loaded in sequence from the memory array to the first-level buffer latches and the second-level buffer latches in the page buffer, and one or more intra-stream cache read commands to move data of the pages in the page buffer on the data path circuits to the input/output interface.

2. The device of claim 1, wherein the memory array comprises NAND flash memory.

3. The device of claim 1, wherein the input/output interface comprises a Serial Peripheral Interface port.

4. The device of claim 1, the data path circuits including a third buffer level, and including ECC circuits connected to the data path circuits, which execute ECC operations on pages held in the third buffer level.

5. The device of claim 1, wherein pages in the stream of pages have a page width X loaded in parallel to the page buffer, and the data path circuits include a third buffer level, and the cache read operation including:
   transferring portions of the page of data from the third buffer level to the input/output interface on a data path having bus width Z, where Z is less than X.

6. A memory device, comprising:
a memory array including a plurality of bit lines;
a page buffer coupled to the plurality of bit lines having a page width X, the page buffer including a plurality of circuit modules, first-level buffer latches and second-level buffer latches, and circuits to latch data from the data output from the circuit modules to the first-level buffer latches, and to transfer data from the first-level buffer latches to the second-level buffer latches, and to output data from a selected one of the first-level buffer latches and the second-level buffer latches;
an input/output interface for I/O data units having an I/O width Z less than the page width;
data path circuits connected between the page buffer and the interface; and
a controller responsive to commands received at the input/output interface, to control memory operations including a continuous page read operation to output a stream of pages at the input/output interface, including responding to a series of commands, the series including a first command to start the continuous read operation including transferring a page of data having page width X from the memory array to the first-level buffer latches in the page buffer in a page read interval, transferring the page of data from the first-level buffer latches to the second-level buffer latches in the page buffer, and the series including one or more intra-stream cache read commands to transfer I/O data units of the page of data from the second-level buffer latches to the input/output interface on the data path circuits.

7. The device of claim 6, the data path circuits including a third buffer level, and including ECC circuits connected to the data path circuits, which execute ECC operations on pages held in the third buffer level.

8. The device of claim 7, wherein:
the third buffer level includes first and second parts coupled to the page buffer by a first inter-buffer data path having buffer width Y, where Y is less than X and greater than Z, for transfer of a first part of a page and ECC bits from the second-level buffer latches to the first part in one memory cycle, by a second inter-buffer data path having buffer width Y, where Y is less than X and greater than Z, for transfer of a second part of a page and ECC bits from the second-level buffer latches to the second part of the third buffer level,
a buffer data bus system operable to connect the ECC circuits to each of the first and second parts of the third buffer level for execution of the ECC operations.

9. The device of claim 7, wherein:
the ECC circuits execute a first ECC function on pages held in the third buffer level and a second ECC function during transfer of data from the third buffer level to the input/output interface;
the third buffer level includes first and second parts coupled to the page buffer by a first inter-buffer data path having buffer width Y, where Y is less than X and greater than Z, for transfer of a first part of a page and ECC bits from the second buffer level to the first part in one memory cycle, by a second inter-buffer data path having buffer width Y, where Y is less than X and greater than Z, for transfer of a second part of a page and ECC bits from the second buffer level to the second part of the third buffer level; and
a buffer data bus system operable to connect the ECC circuits to each of the first and second parts of the third buffer level for execution of the first ECC function, and to connect each of the first and second parts of the third buffer level for the second ECC function to the input/output interface, the bus system having the bus width Z.

10. The device of claim 7, wherein the ECC operations include operating on the data of width Z sequentially over data in selected one of the first and second parts of the third buffer level.

11. The device of claim 6, wherein:
the controller responds to the first command to initiate a continuous page read operation, to transfer a first addressed page in the stream from the memory array to the first-level buffer latches, then to move the first addressed page from the first-level buffer latches to the second-level buffer latches, and to move the first addressed page from the second-level buffer latches through the data path circuits to the interface;
the controller responds to a first intra-stream command after a first read latency including a next page address to transfer a next addressed page in the stream from the memory array to the first-level buffer latches, and move the next addressed page from the second-level buffer latches through the data path circuits to the interface; and the controller responds to a second intra-stream command after a second read latency including second next page address to output I/O data units of the first addressed page to the interface.

12. The device of claim 6, wherein the memory array comprises NAND flash memory.

13. The device of claim 6, wherein the input/output interface comprises a Serial Peripheral Interface SPI port.

14. A method for operating a memory device for a read of a stream of pages, the device including a page buffer having first and second-level latches, a third buffer level and an input/output interface, comprising:

in a first stage in a continuous read operation initiated in response to a continuous page read command, moving data of a preceding page from the first-level buffer latches in the page buffer to the second-level buffer latches, and transferring a current page from a memory array to the first-level buffer latches;

in a second stage, moving data of the preceding page from the second-level buffer latches to the third buffer level and transferring the current page from the first-level buffer latches to the second-level buffer latches; and in a third stage:

transferring data from a first part of the preceding page from the third buffer level to the interface in response to a first cache read command, and then transferring data from a second part of the preceding page from the third buffer level to the interface in response to a second cache read command, transferring the current page to the third buffer level and executing an ECC operation over data in the first part of the page in the third buffer level, overlapping in time with transferring the second part of the preceding page to the interface, and transferring a second part of the current page to the third buffer level and executing the ECC operation over data in the second part of the current page in the third buffer level; and transferring the first part of the current page to the input/output interface in response to a third cache read command, overlapping in time with executing the ECC operation over data in the second part of the current page in the third buffer level, and then transferring the second part of the current page to the input/output interface response to a fourth cache read command.

15. The method of claim 14, including transferring the first part of the page from the second-level buffer latches to the third buffer level in one buffer memory cycle.

16. The method of claim 14, wherein the memory array comprises NAND flash memory.

17. The method of claim 14, wherein the input/output interface comprises a Serial Peripheral Interface port.

18. The device of claim 1, wherein the circuit module includes a data transfer switch to transfer data from a first data output node of the first-level data latch to a second data output node in response to signals that control transfer timing, the second data output node being connected to the page buffer output and to the second-level data latch.

* * * * *